(12) United States Patent
Kwak et al.

(10) Patent No.: US 7,179,736 B2
(45) Date of Patent: *Feb. 20, 2007

(54) METHOD FOR FABRICATING PLANAR SEMICONDUCTOR WAFERS

(75) Inventors: Byung-Sung Leo Kwak, Portland, OR (US); Peter Burke, Portland, OR (US); Sey-Shing Sun, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 198 days.

This patent is subject to a terminal disclaimer.

(21) Appl. No.: 10/966,074

(22) Filed: Oct. 14, 2004

(65) Prior Publication Data

US 2006/0084267 A1    Apr. 20, 2006

(51) Int. Cl.
*H01L 21/4763* (2006.01)

(52) U.S. Cl. ...................................... 438/626; 438/678

(58) Field of Classification Search ................ 257/672, 257/674, 675, 626, 629, 631, 637; 438/672, 438/674, 675, 626, 629, 631, 637, 678
See application file for complete search history.

(56) References Cited

U.S. PATENT DOCUMENTS

| 2004/0188265 A1* | 9/2004 | Cao et al. ................... 205/170 |
| 2005/0095854 A1* | 5/2005 | Uzoh et al. ................. 438/678 |
| 2005/0109627 A1* | 5/2005 | Sun et al. ................... 205/115 |
| 2005/0145499 A1* | 7/2005 | Kovarsky et al. ........... 205/103 |
| 2005/0224358 A1* | 10/2005 | Kwak et al. ................. 205/157 |
| 2005/0274621 A1* | 12/2005 | Sun et al. ................... 205/209 |
| 2005/0274622 A1* | 12/2005 | Sun et al. ................... 205/209 |
| 2006/0065536 A1* | 3/2006 | Jentz et al. ................. 205/291 |
| 2006/0079084 A1* | 4/2006 | Baskaran et al. ........... 438/652 |

OTHER PUBLICATIONS

Kwak, Leo, "LP Enhancement Data," LSI Logic, Apr. 28, 2004, 9 Pages.

* cited by examiner

*Primary Examiner*—S. V. Clark
(74) *Attorney, Agent, or Firm*—Beyer, Weaver & Thomas, LLP

(57) ABSTRACT

The present invention relates to a method of fabricating planar semiconductor wafers. The method comprises forming a dielectric layer on a semiconductor wafer surface, the semiconductor wafer surface having vias, trenches and planar regions. A barrier and seed metal layer is then formed on the dielectric layer. The wafer is next place in a plating bath that includes an accelerator, which tends to collect in the vias and trenches to accelerate the rate of plating in these areas relative to the planar regions of the wafer. After the gapfill point is reached, the plating is stopped by removing the plating bias on wafer. An equilibrium period is then introduced into the process, allowing higher concentrations of accelerator additives and other components of the bath)] above the via and trench regions to equilibrate in the plating bath. The bulk plating on the wafer is resumed after equilibration. Over-plating on the wafer in the areas of the vias and trenches is therefore avoided, resulting in a more planar metallization layer on the wafer, without the use of a leveler additive which adversely affects the gapfill capability.

15 Claims, 4 Drawing Sheets

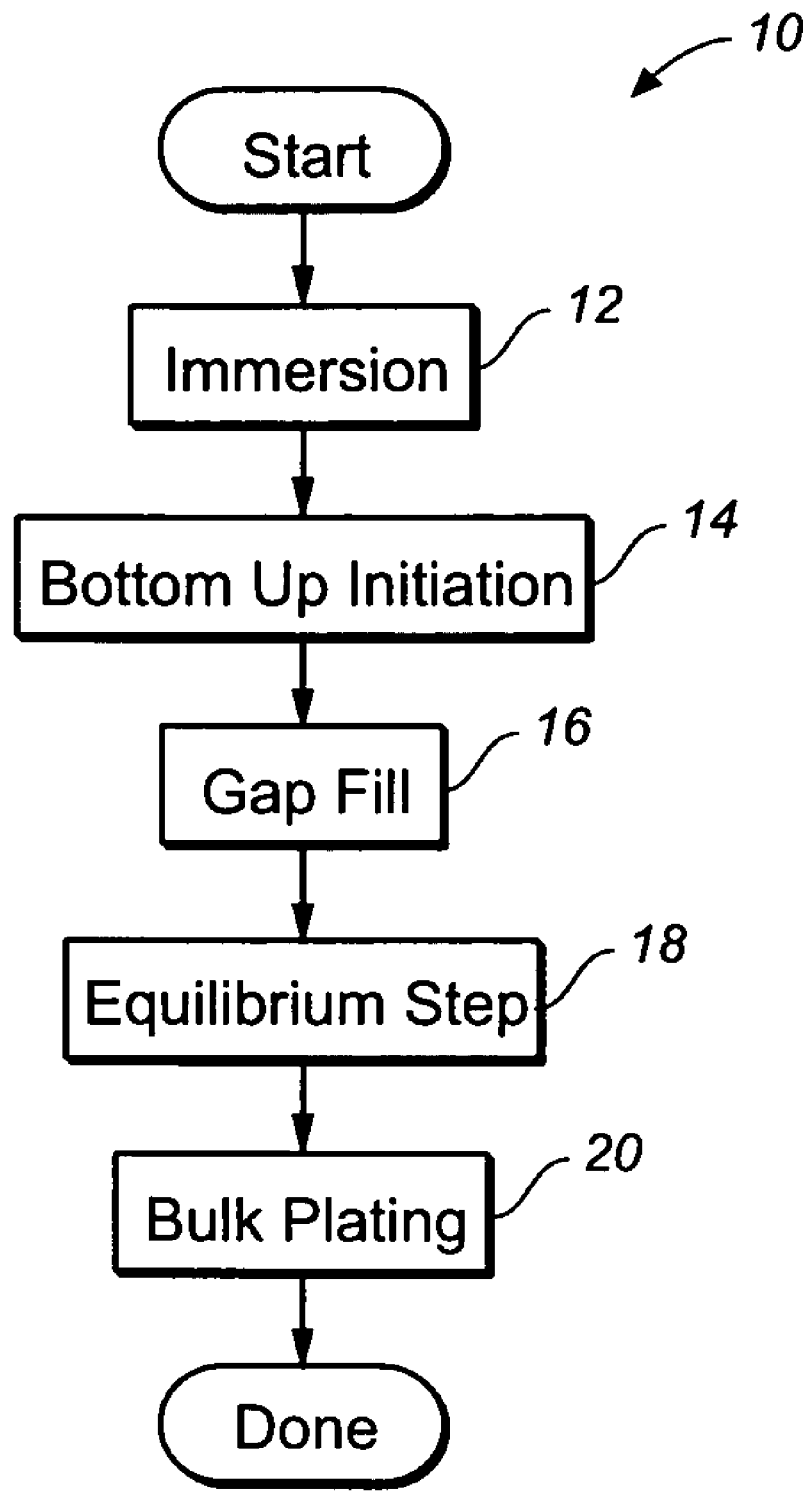
FIG._1

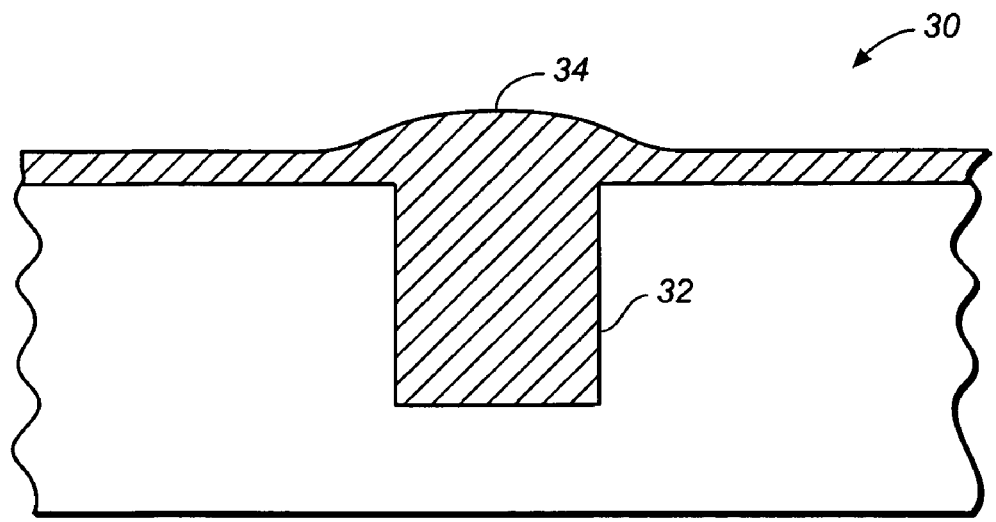
FIG._2A
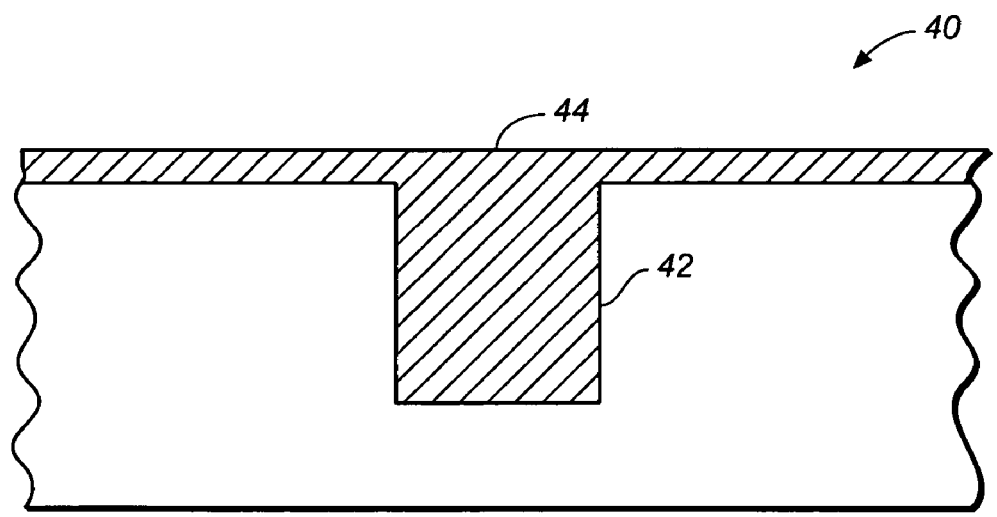
FIG._3A

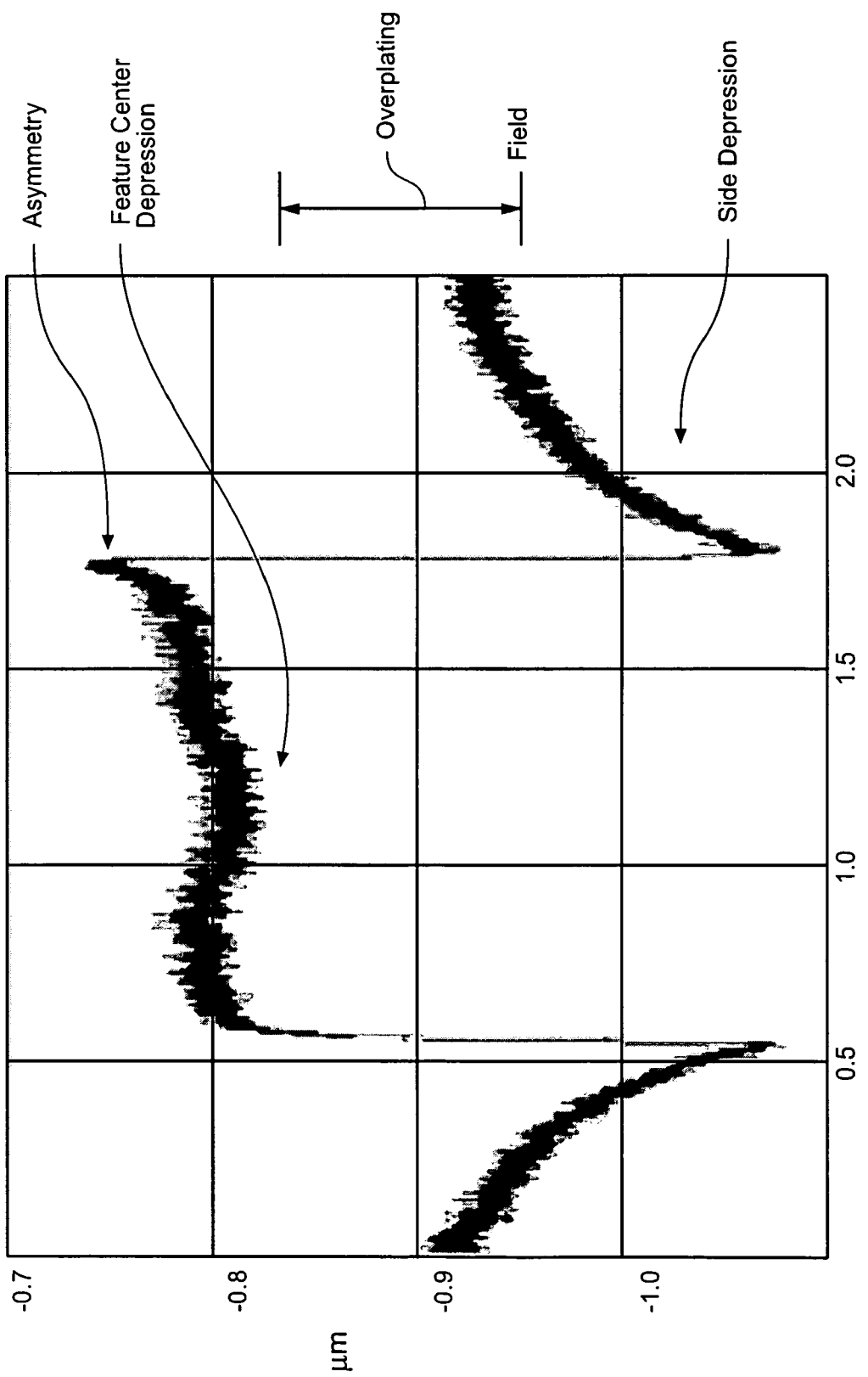
FIG._2B

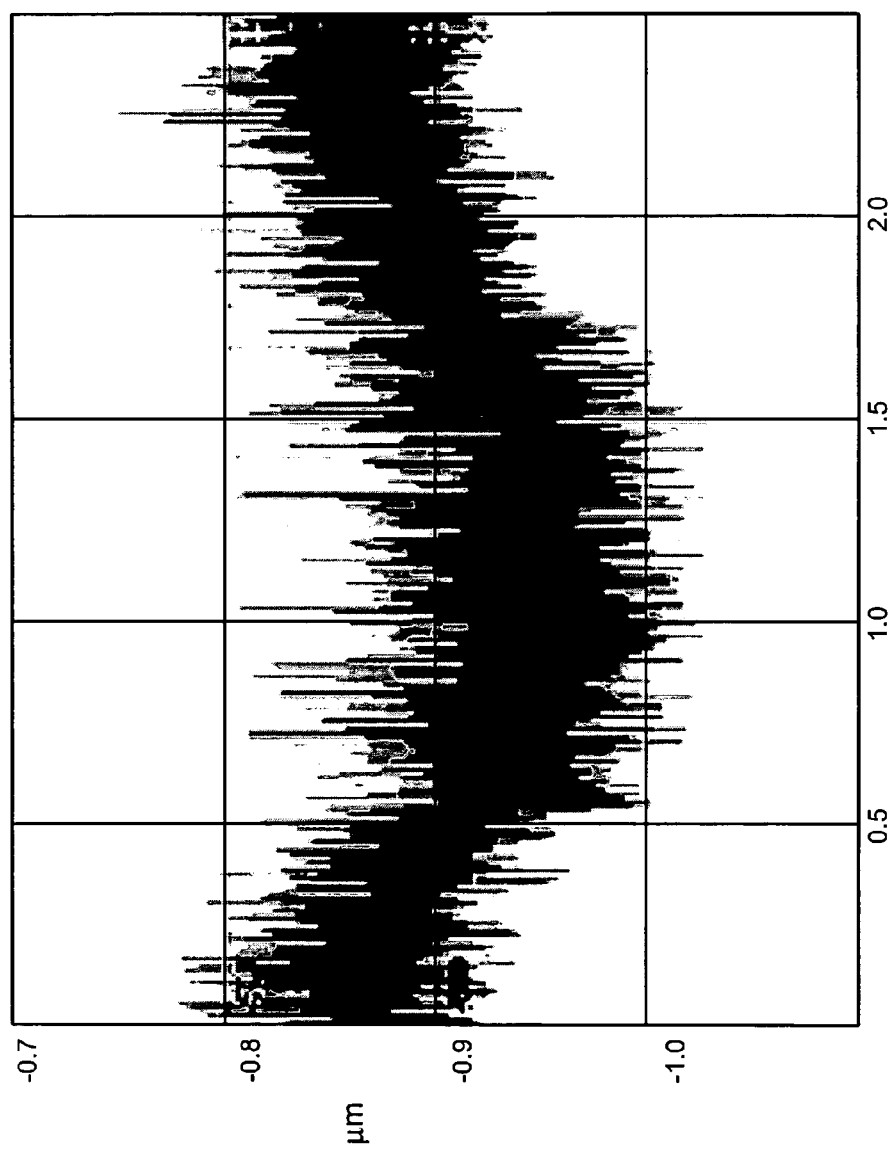
FIG._3B

METHOD FOR FABRICATING PLANAR SEMICONDUCTOR WAFERS

BACKGROUND OF THE INVENTION

1. Field of the Invention

The present invention relates generally to semiconductor fabrication, and more particularly, to a method for fabricating planar semiconductor wafers.

2. Description of the Related Art

Since the inception of the semiconductor industry, improved performance has generally resulted from: (i) the continued reduction in the size of transistors; and (ii) the use of different material to improve the switching speed of transistors. Generally speaking, a new generation of semiconductor fabrication technology is created approximately every two years. With each new generation, the feature size of the transistors are reduced, resulting in faster switching speeds. In addition, semiconductor process engineers are continually striving to use new and different materials to further increase performance. For example, for many years aluminum was used for metal interconnects. More recently, however, device engineers have started using higher conductivity metals, such as copper, and better dielectrics, to improve the signal propagation speed between transistors.

A copper metal interconnect layer is generally formed by the following steps: (i) applying a blanket dielectric layer over the wafer surface; (ii) patterning of the dielectric with vias and trenches which define an interconnect pattern; (iii) applying a barrier layer (e.g., Tantalum Nitride) over the wafer surface during a physical or chemical vapor deposition step. The barrier layer prevents migration of subsequently deposited copper into the dielectric layer; (iv) applying a blanket copper seed layer during another deposition step; (iv) depositing an additional copper film in an electrolytic copper plating bath to fill the vias and trenches and to provide additional bulk to the blanket copper layer; and performing a chemical-mechanical polishing (CMP) step on the wafer surface to smooth or planarize the wafer surface after the plating process and to create the intended interconnect scheme.

During the bath plating step, the wafer undergoes a sequence of conditions. The electrolytic bath is typically an acidic solution. When the wafer is first immersed, the bias applied to the wafer prevents the acid from attacking the copper seed layer. After the initial immersion, a "bottom-up" initiation condition occurs. Organic additives, such as accelerators and suppressors, are included in the plating solution. The accelerators tend to concentrate in the vias or trenches of the wafer. As a result, the copper plating occurs at a faster rate in the vias and trenches than on the planar surface areas of the wafer. This phase is called "gapfill". Eventually the trenches and vias fill up with the plating metal. The end of the gapfill phase occurs when the smallest to moderate sized vias and trenches are completely filled. The moderate size cross over can range from 0.25 to 1.0 microns, depending on the waveforms of the bulk plating. Larger features will typically only be partially filled at the gapfill point. However, this typically is not problematic because the subsequent bulk plating is performed at higher rate, filling in these areas. The timing of the gapfill point is typically determined by analyzing empirical data that is generated from previous wafer runs. At the gapfill point, the bulk copper plating step begins, by changing the bias applied to the wafer. When the bulk plating is complete, the wafer is removed from the bath and the CMP step is performed.

The aforementioned process can potentially have a number of problems. The high concentration of the accelerant in the vias and trenches causes an over-plating condition in these same areas during the subsequent bulk plating. As a result, the bulk copper layer is often uneven, with bumps or humps in the areas of the smaller to moderate sized vias and trenches. This problem is exasperated as process technologies improve and feature sizes get smaller and smaller. One attempted solution to this problem is the inclusion of another suppressor, called a leveler, into the bath solution. The leveler is attracted to high copper concentration regions, i.e. over features where the gapfill (i.e., bottom-up) process is occurring. As a result, improved local planarity is achieved. However, since the leveler is a suppressor, the gapfill process is degraded for the very reason local planarity is improved. Another issue with the levelers is that they create additional oxidation and breakdown byproducts in the plating bath. As a consequence, the electrolyte plating solution has to be either regenerated and/or replaced to eliminate this build up. The use of levelers therefore increases costs, potentially decreases yields, and creates additional environmental concerns. It will therefore become more difficult to achieve good gapfill capability while maintaining good local planarity across the wafer surface in the future, and as a result, fabricating semiconductor wafers with multiple interconnect layers will become problematic.

Accordingly, there is a need for fabricating planar semiconductor wafers by introducing an equilibrium period after the gapfill point so that the high concentrations of accelerant can equilibrate in the plating solution before bulk plating, resulting in a smooth and even bulk copper plated layer, without impacting the gapfill capability.

SUMMARY OF THE INVENTION

The present invention relates to a method of fabricating planar semiconductor wafers. The method comprises forming a dielectric layer on a semiconductor wafer surface, the semiconductor wafer surface having vias, trenches and planar regions. A barrier and seed metal layer is then formed on the dielectric layer. The wafer is next place in a plating bath that includes an accelerator, which tends to collect in the vias and trenches to accelerate the rate of plating in these areas relative to the planar regions of the wafer. After the gapfill point is reached, the plating is stopped by removing the plating bias on wafer. An equilibrium period is then introduced into the process, allowing higher concentrations of accelerator additives and other components of the bath above the via and trench regions to equilibrate in the plating bath. The bulk plating on the wafer is resumed after sufficient equilibration. Over-plating on the wafer in the areas of the vias and trenches is therefore avoided, resulting in a more planar metallization layer on the wafer, without the use of a leveler additive, which adversely affects the gapfill capability.

BRIEF DESCRIPTION OF THE DRAWINGS

The invention, together with further advantages thereof, may best be understood by reference to the following description taken in conjunction with the accompanying drawings in which:

FIG. 1 is a flow diagram illustrating the steps for fabricating a semiconductor die according to the present invention.

FIG. 2A is cross section view of a semiconductor wafer illustrating an over-plating condition according to the prior art.

FIG. 2B is an atomic force profiler scan of a structure represented by FIG. 2A.

FIG. 3A is a cross section view of a semiconductor wafer illustrating the impact when fabricated using the process of the present invention.

FIG. 3B is an atomic force profiler scan of a structure represented by FIG. 3A.

In the figures, like reference numbers refer to like components and elements.

DETAILED DESCRIPTION OF THE INVENTION

Referring to FIG. 1, a flow diagram illustrating the steps for plating a semiconductor wafer with a copper metal layer in a plating bath according to the present invention. The flow diagram 10 specifies the following conditions occurring in the plating bath: the initial immersion of the wafer in the plating bath 12, a bottom up plating 14, a gapfill point 16; an equilibrium condition 18, and a bulk plating step 20. The steps 12 through 16 and 20 are generally the same as described in the background and therefore are not describe in detail herein.

The equilibrium condition 18 occurs after the gapfill point 16 is reached. As previously noted, the gapfill phase occurs when the vias and trenches of the smallest to the moderate sized feature sizes are completely filled, while larger features are only partially filled. The moderate size cross over may range can from 0.25 to 1.0 microns depending on the waveforms of the bulk plating. Again, the partial filling of the larger features is not a problem since these areas will be filled in during the subsequent bulk plating step where the plating is performed at higher rate. The timing of the gapfill point is typically determined by analyzing empirical data generated from previous wafer runs.

After the gapfill conditioned is reached, the higher concentrations of accelerant accumulated in the vias and trenches are allowed to equilibrate. In other words, the accelerant and other components of the bath is given sufficient time, and other methodologies, to evenly dispersed throughout the wafer surface before bulk plating begins. Consequently, when the bulk plating step takes place, the bulk copper layer is more evenly plated on the wafer surface. The equilibrium can be achieved in a number of different ways. In one embodiment, the bias on the wafer is removed for a period of time sufficient to allow the accelerant and other components of the bath to equilibrate. For example, the bias can be removed for a period ranging from to 10 to 60 seconds. In yet another embodiment, a low negative/reverse bias is applied to the wafer for a "short" duration of time ranging from 50 mV to 1V to introduce field effect to enhance the equilibration. The duration should be correlated with the de-plating rate and the amount of desired copper removal. In yet another embodiment, a pulsed bias (i.e., repeated cycles of forward and reverse bias) can be applied to the wafer, to minimize the copper loss but still maintain the electric field effect. With this application, the pulsed bias preferably results in zero net loss of copper. In conjunction with each of these embodiments, the flow dynamics can be adjusted to enhance to equilibration process, for example, by increasing the rotation speed to reduce the local boundary layer for faster diffusion. In yet another embodiment, equilibration can be repeated multiple times during bulk plating. For example, bulk plating can be stopped, followed by an equilibration period, and then plating can be resumed. In yet another embodiment, bulk plating can be further controlled by using plating recipes and waveforms to minimize the redevelopment of local disparity in the accelerator concentrations in the plating bath.

In one embodiment, the electrolytic copper plating typically takes place in an acidic solution containing $CuSO_4$, $H_2SO_4$, HCl, or $CuCl_2$. In addition, to help with gapfill and local planarity, organic additives, such as an accelerator, suppressor, and/or leveler, may be added according to various embodiments. Typically, the plating solution is kept at constant temperature while the concentrations of each component is monitored and controlled to maintain consistent behavior. The actual plating typically takes place in a "fountain-like" reactor/cell, where the wafer is immersed to establish electrical contact with the electrolyte through an external electrical circuit to drive the plating process. Parameters pertinent to the electroplating cell include, among many, electrolyte flow rate, wafer rotation speed, and immersion height. Ranges for these parameters depend on tool design and desired process regime. Some parameters, like flow rate and rotation speed, affect similar outputs, and therefore, the interaction between them should be considered. Parameters associated with plating recipes include, bias voltage, current density, waveform type, and duration. Typical recipes are driven by current density, which affects the driving voltage according to the overall impedance of the electrochemical circuit, and ranges from a few $mAmp/cm^2$ to several tens of $mAmp/cm^2$.

A wide range of specific formulas may be used for the accelerator compounds. As used herein, the term "accelerator" generally means any organic chemical molecules that absorb onto the plating surface to enhance the electron transfer between the plating surface and the cations ($Cu^{2+}$ in this example) in the solution. In general, the functional groups (type and density) and molecular size play a critical role in how the accelerator molecules function during plating. The molecules of a typical accelerator are small with high free electron density (enhances the electron transfer). One example of these accelerator molecules is: SPS, Bis(3-sulfopropyl) disulfide, whose formula is $-SO_3-CH_2-CH_2-CH_2-S-S-CH_2-CH_2-CH_2-SO_3$ Other additives such as levelers and suppressors can be added to the plating solution to achieve a desired result. Suppressors are added to enhance gapfill. While the accelerators would "diffuse" and accumulate in the features, the suppressors are large, and therefore, would not diffuse as much into the features. They do, however, diffuse to field areas to "suppress" plating. Thus, the result is enhanced plating in the features and suppressed plating on the field areas, during the so-called "bottom-up" plating. Levelers are added for the purpose stated in this paragraph—to suppress the areas of high plating "bottom-up" plating area. Levelers would typically have high molecular weight, but would have nitrogen-containing functional groups, with an unbonded electron pair. This "unbonded" electron pair of the nitrogen make this type attracted to regions of higher $Cu^{2+}$ species, the regions of the "accelerated plating", and thereby, help reduce plating rate during the "momentum" growth phase. However, this behavior is effective even during the gapfill stages (because the bottom up fill results in higher $Cu^{2+}$ concentration in those areas as well) resulting in diminished gapfill capability. Suppressors would also have high molecular weights with "SP3" bonding (low free electron density) characteristics, which hinder electron transfer from Cu surfaces to $Cu^{2+}$ in the electrolyte plating bath. Suppressor example would be polyethylene or polypropylene glycol: $H-(O-CH_2-CH_2)_n-(O-CH_2-CH_2-CH_2)_m-OH$.

Referring to FIG. 2A, a cross section of a semiconductor wafer 30 in the area of a via or trench 32 is shown. This wafer 30 was fabricated using the prior art procedure of commencing bulk plating immediately after the gapfill. As a result, over-plating occurs, as illustrated by the "bump" designated by reference number 34. In FIG. 2B, an atomic force profiler (AFP) scan across 0.18 microns with a 50% pattern density structure is shown to demonstrate bulk plating using the prior art. The rise in the profile scan shows the "overplating" condition, as well as other adverse effects of the prior art.

Referring to FIG. 3, a cross section of a semiconductor wafer 40 in the area of a via or trench 42 is shown. This wafer 40 was fabricated using the sequence of the present invention, allowing the accelerants to equilibrate after gapfill and before bulk plating. As a result, the bulk plating layer 44 on the wafer is even and smooth, avoiding the over-plating condition. In FIG. 3B, another AFP scan is shown demonstrating the bulk plating after the equilibrate step. Note, how the over-plating, as well as other negative consequences of the prior art method (side depression and asymmetry), condition does not exist. The actual dimension of the structure in FIG. 3B is 0.18 µm with 50% pattern density, just as in FIG. 2A.

Although the foregoing invention has been described in some detail for purposes of clarity of understanding, it will be apparent that certain changes and modifications may be practiced within the scope of the appended claims. The described embodiments should be taken as illustrative and not restrictive, and the invention should not be limited to the details given herein but should be defined by the following claims and their full scope of equivalents.

We claim:

1. A method comprising:
    forming a dielectric layer on a semiconductor wafer surface, the semiconductor wafer surface having vias, trenches and planar regions;
    forming a seed metal layer on the dielectric layer;
    plating the wafer in a plating bath, the plating bath including an accelerator which tends to collect in the vias and trenches and which accelerates the rate of plating in the vias and trenches relative to the planar regions of the wafer;
    determining a gapfill point on the wafer during the plating,
    allowing the accelerator to equilibrate in the plating bath after the gapfill point; and
    performing a bulk plating on the wafer in the plating bath after equilibration.

2. The method of claim 1, wherein the plating bath contains copper for plating onto the wafer.

3. The method of claim 1, wherein the accelerator is an organic compound.

4. The method of claim 3, wherein the accelerator comprises molecules that absorb onto the plating surface to enhance the electron transfer between the plating surface and the cations in the plating bath.

5. The method of claim 1, wherein the seed metal includes but is not limited to copper and ruthenium.

6. The method of claim 1, wherein the gapfill point is determined by ascertaining when vias and/or trenches of a predetermined size are substantially filled during gapfill plating.

7. The method of claim 1, further comprising applying a negative bias on the wafer while the accelerant is equilibrating.

8. The method of claim 1, further comprising applying a pulsing bias on the wafer while the accelerant is equilibrating.

9. The method of claim 1, wherein the gapfill point is determined when feature sizes of 1.0 microns or less are substantially filled during the plating.

10. The method of claim 1, wherein the accelerator is allowed to equilibrate in the plating bath for a period of 10 seconds or more.

11. The method of claim 1, wherein the accelerator equilibrates in the plating bath for a period of 60 seconds or less.

12. The method of claim 1, further comprising modulating the flow dynamics of the plating bath to enhance the equilibration.

13. The method of claim 1, further comprising performing the equilibration multiple times during the bulk plating.

14. The method of claim 1, wherein other components besides the accelerator are allowed to equilibrate in the plating bath after the gapfill point.

15. The method of claim 1, further comprising controlling the bulk plating by using plating recipes and waveforms to minimize the redevelopment of local disparity of accelerator concentrations in the plating bath.

* * * * *